United States Patent [19]
Masakado et al.

[11] Patent Number: 6,134,210
[45] Date of Patent: Oct. 17, 2000

[54] LASER BEAM EMITTING DEVICE AND AN OPTICAL PICKUP PROVIDED WITH THE LASER BEAM EMITTING DEVICE

[75] Inventors: Osamu Masakado, Atsugi; Kenji Kan, Shounan-machi, both of Japan

[73] Assignee: Mitsumi Electric Co., Ltd.

[21] Appl. No.: 09/087,320
[22] Filed: May 29, 1998
[30] Foreign Application Priority Data May 29, 1997 [JP] Japan ..................................... 9-154323

[51] Int. Cl.[7] ....................................................... G11B 7/00
[52] U.S. Cl. .............................................. 369/116; 369/54
[58] Field of Search ................................ 369/116, 54, 53, 369/58, 44.41, 44.42, 112

[56] References Cited

U.S. PATENT DOCUMENTS

| 4,721,850 | 1/1988 | Sakai et al. . |
| 5,539,718 | 7/1996 | Hoshi et al. . |
| 5,563,870 | 10/1996 | Silverstein ........................... 369/116 X |

FOREIGN PATENT DOCUMENTS

| 0 426 035 A2 | 5/1991 | European Pat. Off. . |
| 0 623 922 A1 | 11/1994 | European Pat. Off. . |

OTHER PUBLICATIONS

Patent Abstracts of Japan: Application No.: 03276432, vol. 016, No. 100, Mar. 11, 1992.
Patent Abstracts of Japan: Application No.: 05081695, vol. 017, No. 422, Aug. 5, 1993.

Primary Examiner—Muhammad Edun
Attorney, Agent, or Firm—Patents+TMS, P.C.

[57] ABSTRACT

A laser beam emitting device has a laser beam source for emitting a laser beam having a prescribed effective optical path region; and a light-receiving element positioned outside the effective optical path region of the laser beam emitted by the laser beam source and having a plurality of light-receiving regions for detecting intensity of the emitted laser beam. In this device, the output of the laser beam source is adjusted in response to the intensity of the emitted laser beam detected by at least one of the plurality of the light-receiving regions of the light-receiving element. The light-receiving element includes a first light-receiving region located at a position near the optical axis and a second light-receiving region located at a position farther from the optical axis than the position of the first light-receiving region. The arrangement of the first and second light-receiving regions can provide at least three sensitivity levels by selecting one of electrical current values outputted from the plurality of light-receiving regions or any combination of these electrical current values. The laser beam emitting device is provided in an optical pickup for use in an optical disc drive such as CD-R drive.

10 Claims, 4 Drawing Sheets

LASER BEAM EMITTING DEVICE AND AN OPTICAL PICKUP PROVIDED WITH THE LASER BEAM EMITTING DEVICE

BACKGROUND OF THE INVENTION

1. Field of the Invention

The present invention relates to a laser beam emitting device and an optical pickup provided with the laser beam emitting device, and in particular relates to a laser beam emitting device for use in an optical pickup for reading out information from or writing information onto an optical disc and an optical pickup provided with the laser beam emitting device.

2. Description of the Background Art

In optical disc drives for optical discs such as CD-ROM or the like, an optical pickup is provided to read out information recorded on an optical disc. The optical pickup is equipped with a laser beam source for emitting a laser beam and an optical system for guiding the laser beam toward the optical disc.

Further, in recent years, disc drives in which a single optical pickup is used not only to read out information recorded on an optical disc but also to write information onto an optical disc have been developed (e.g., CD-R drives).

In the optical pickup having such reading and writing functions, the output of the laser beam source changes depending on whether information is being read out or written in. Specifically, in writing information onto the optical disc, a number of pits are formed onto an information recording surface of the optical disc by means of the emission of the laser beam. Therefore, when information is being written onto the optical disc, the laser beam output is made to be much larger (e.g., ten to twenty times larger) than the output used during reading out the information.

Now, in such an optical pickup, in order to change the intensity of the laser beam (quantity of light) emitted from the laser beam source, there is provided a means for monitoring (detecting) the intensity of the laser beam.

As shown in FIG. 4, such a means is equipped with a light-receiving element (PD: photodiode) 21 provided outside an effective optical path region 26 of a laser beam emitted by a laser beam source 20, in which laser light 28 outside the effective optical path region 26 is received by the light-receiving element 21 and photoelectrically converted into electrical signals. Then, based on the relative strength of thus obtained electrical signals, the intensity of the laser beam (quantity of light) emitted from the laser beam source 20 is detected.

However, even in the case where the output (the intensity of the emitted laser beam) of the laser beam source 20 is fixed, dispersions or deviations will arise in the electrical current value outputted by the light-receiving element 21 due to the reasons (1)–(3) listed below, and this makes it impossible to accurately monitor the intensity of the laser beam emitted from the laser beam source 20.

(1) Light-receiving elements have different individual characteristics (e.g., sensitivity).

(2) The illuminance distribution (far field pattern) of the emitted laser beam is different for each individual laser beam source.

(3) The intensity of the laser beam has a prescribed distribution (Gaussian distribution) depending on the distance from the optical axis 25, and for this reason there will be a difference in the quantity of light received by the light-receiving element 21 depending on the position of the light-receiving element 21, in particular the distance from the optical axis 25.

The problem described above becomes highly prominent in the case of the disc drives such as CD-R drives in which the output of the laser beam source undergoes a large change between the reading out and writing in of information.

SUMMARY OF THE INVENTION

In view of the above-described problem, it is an object of the present invention to provide a laser beam emitting device which makes it possible to carry out accurate detection of the intensity of the laser beam emitted from the laser beam source.

Further, it is also an object of the present invention to provide an optical pickup for use in an optical disc drive provided with the laser beam emitting device.

In order to achieve the objects stated above, the laser beam emitting device according to the present invention includes a laser beam source for emitting a laser beam having a prescribed effective optical path region, and a light-receiving element positioned outside the effective optical path region of the laser beam emitted by the laser beam source and having a plurality of light-receiving regions for detecting intensity of the emitted laser beam, wherein the output of the laser beam source is adjusted in response to the intensity of the emitted laser beam detected by at least one of the plurality of the light-receiving regions of the light-receiving element.

According to the laser beam emitting device of the present invention described in the above, since the intensity of the emitted laser beam is detected by the light-receiving element having a plurality of light-receiving regions, it is possible to carry out highly accurate detection of the intensity of the laser beam emitted from the laser beam source. Consequently, when the laser beam emitting device according to the present invention is used in an optical pickup for reading out information from and writing information onto an optical disc, it is possible to properly set the intensity of the laser beam emitted from the laser beam source at the respective appropriate level for reading out or writing in information.

Preferably, the light-receiving element includes a first light-receiving region located at a position near the optical axis and a second light-receiving region located at a position farther from the optical axis than the position of the first light-receiving region.

Further, it is also preferred that the light-receiving element provides at least three sensitivity levels by selecting one of electrical current values outputted from the plurality of light-receiving regions or any combination of these electrical current values.

According to the structure of the laser beam emitting device described above, by selecting an appropriate electrical current value from one of at least two light-receiving regions which are positioned at different distances from the optical axis or a any combination of these electrical current values, it is possible to carry out adjustments at three or more sensitivity levels, and this makes it possible to carry out multilevel adjustments with a simple structure.

In this case, it is also preferred that the first light-receiving region is formed into a roughly L-shaped configuration and the second light-receiving region is formed into a roughly square-shaped configuration arranged inside the corner space of the L-shaped first light-receiving region.

Further, the present invention is also directed to an optical pickup for use in an optical disc drive. The optical pickup comprises a laser beam source for emitting a laser beam toward an optical disc, the laser beam having a prescribed effective optical path region; a laser beam receiving element for receiving the laser beam reflected on the optical disc to produce electrical signals responsive to the intensity of the received laser beam; and means for detecting an intensity of the laser beam emitted from the laser beam source. The detecting means is positioned outside the effective optical path region of the laser beam emitted by the laser beam source and is provided with a plurality of light-receiving regions, wherein the output of the laser beam source is adjusted in response to the intensity of the emitted laser beam detected by at least one of the plurality of the light-receiving regions of the detecting means.

The other objects, features and advantages of the present invention will be made clear in the detailed description of the preferred embodiment given below with reference to the appended drawings.

DETAILED DESCRIPTION OF THE PREFERRED EMBODIMENTS

A detailed description of a preferred embodiment of a laser beam emitting device according to the present invention will now be given with reference to the appended drawings.

Figure 1:
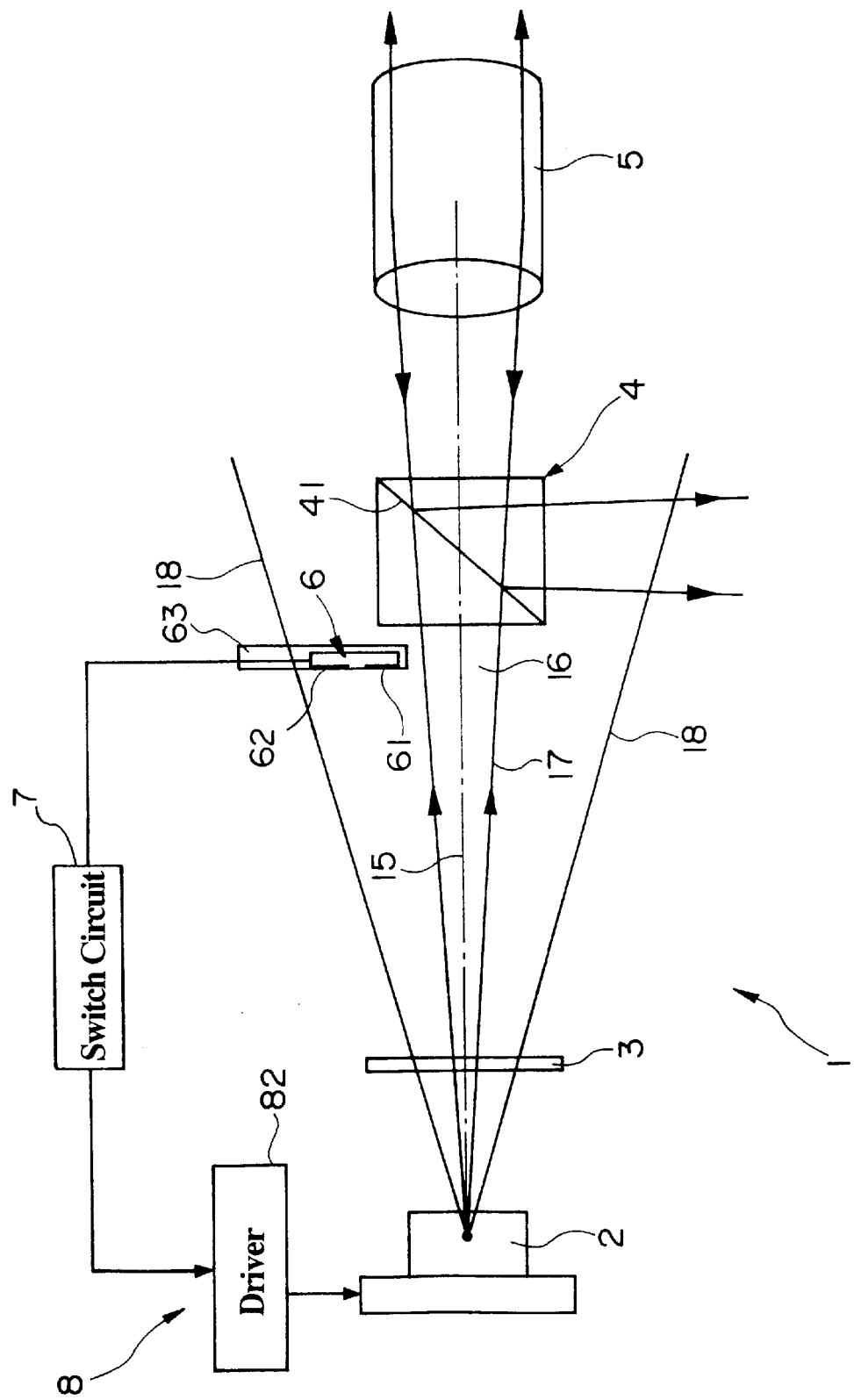
FIG. 1 is a schematic view which shows the outline of an embodiment of a laser beam emitting device according to the present invention.
Figure 2:
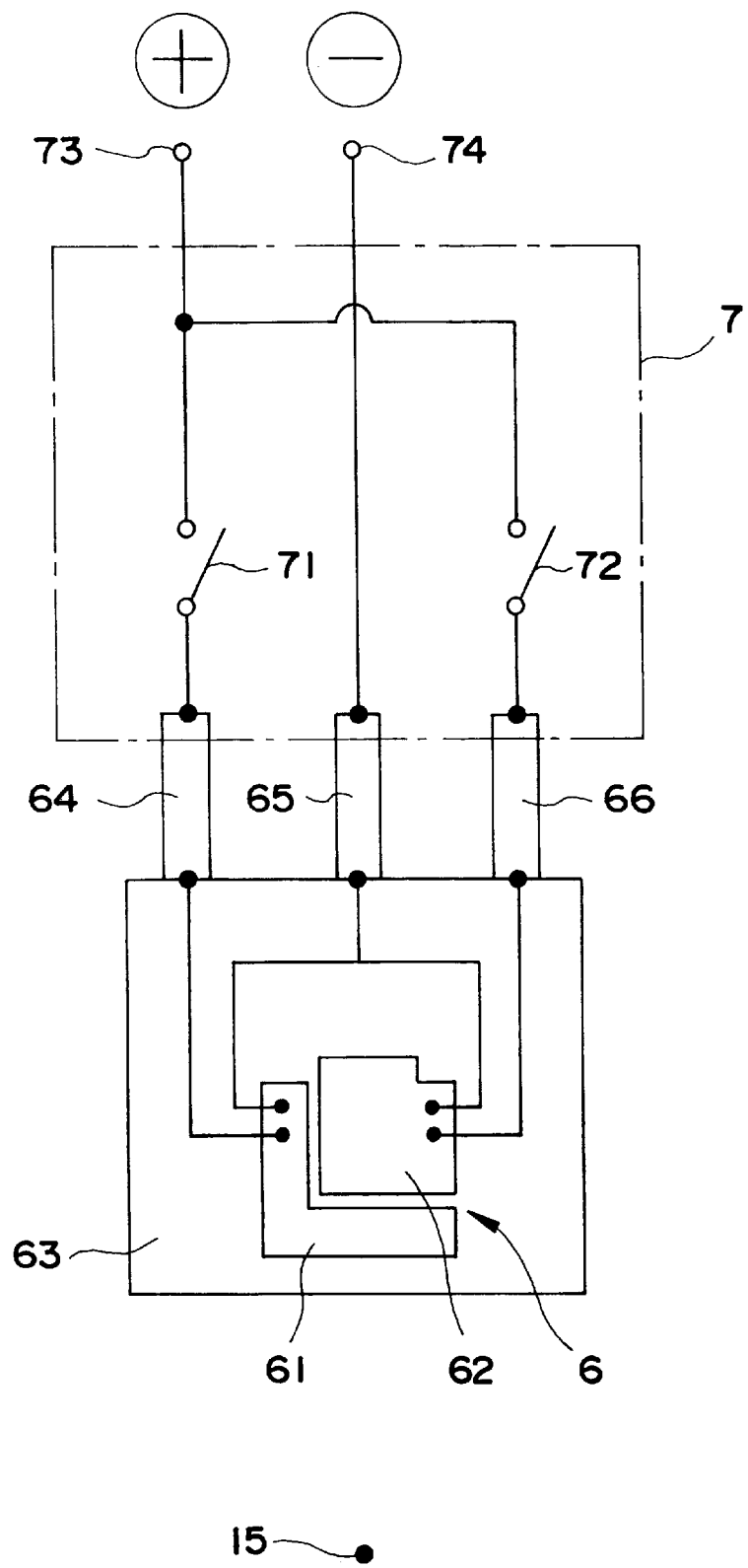
FIG. 2 is a front view which shows the structure of a light-receiving element in the laser beam emitting device shown in FIG. 1.
Figure 3:
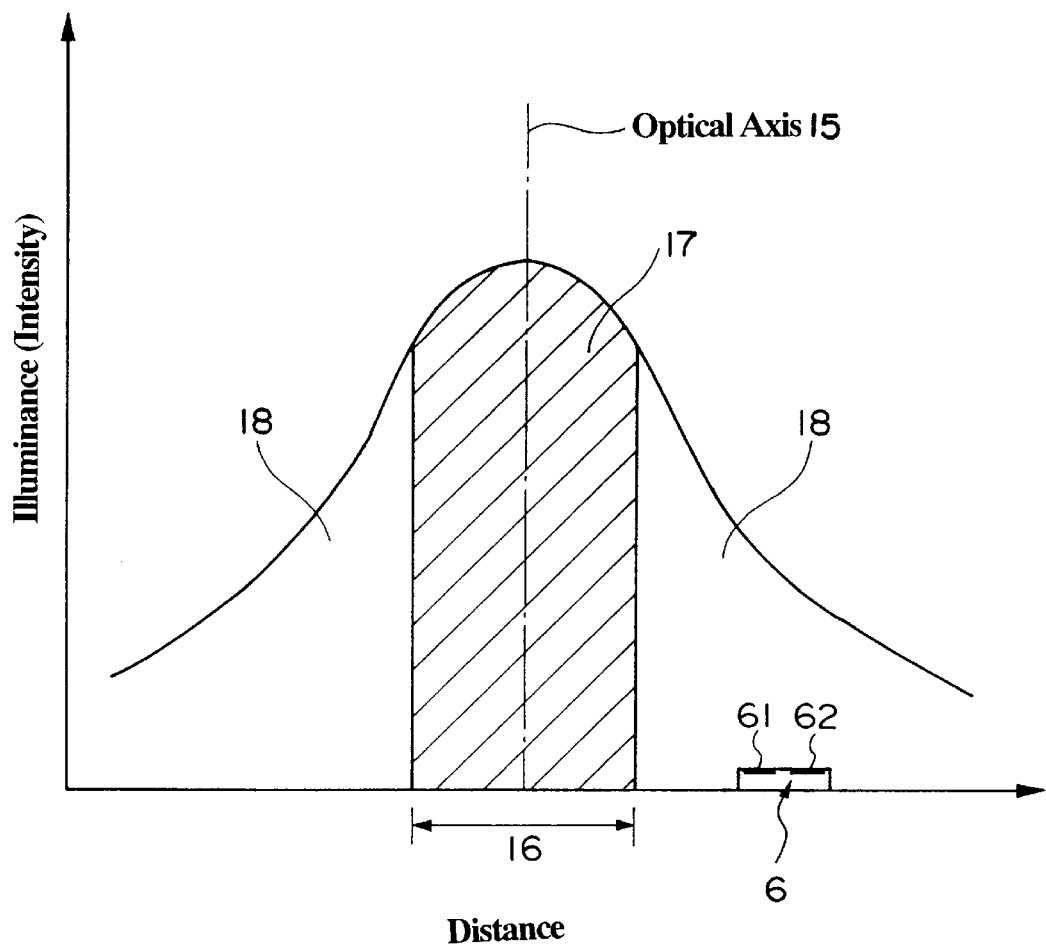
FIG. 3 is a diagram which shows the distribution of the illuminance of a laser beam.
Figure 4:
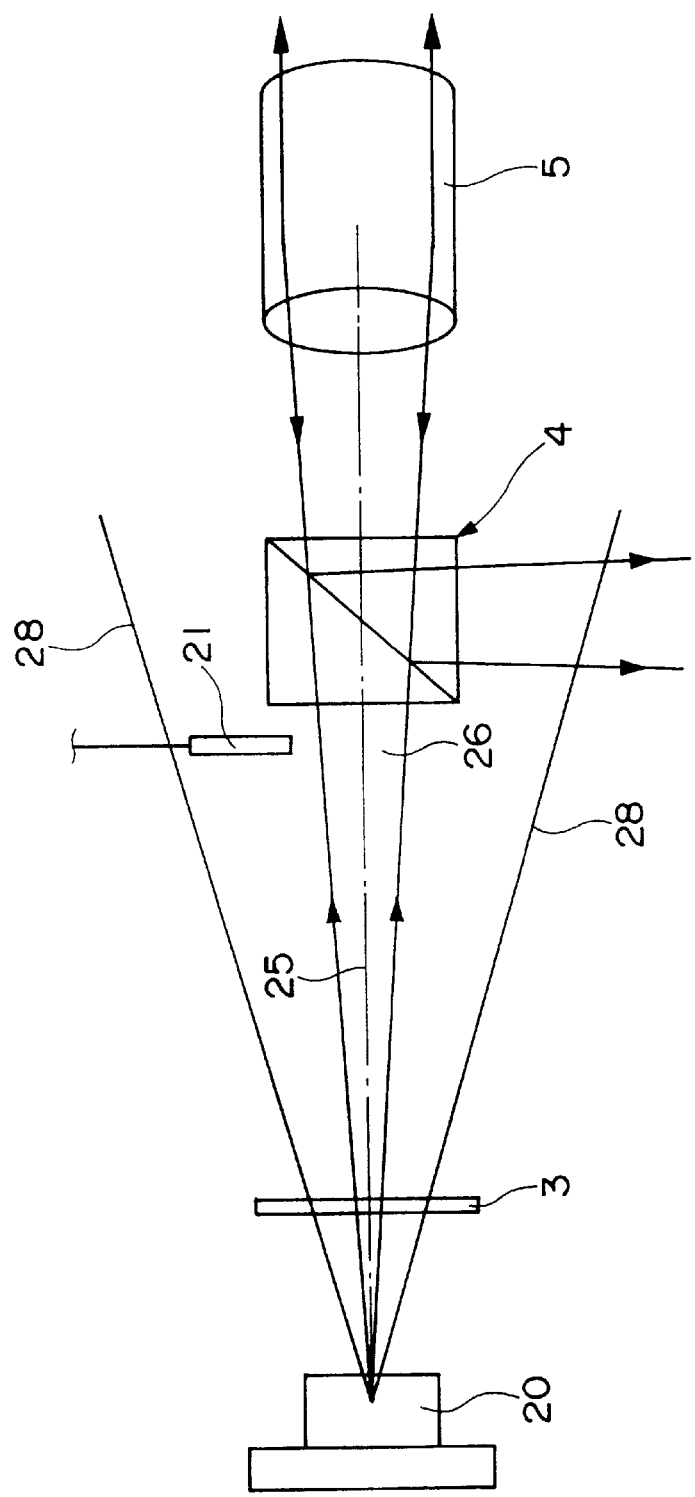
FIG. 4 is a schematic view which shows the outline of other laser beam emitting device.

In this connection, FIG. 1 is a schematic view which shows the outline of an embodiment of a laser beam emitting device according to the present invention, FIG. 2 is a front view which shows the structure of a light-receiving element in the laser beam emitting device shown in FIG. 1, and FIG. 3 is a diagram which shows the distribution of the illuminance of a laser beam.

As shown in FIG. 1, a laser beam emitting device 1 according to the present invention is a device which is capable of reading out information from and writing information onto an optical disc (not shown in the drawings) such as a CD-R, and it is provided in an optical pickup for use in an optical disc drive, for instance. The laser beam emitting device 1 generally includes a laser beam source 2 for emitting a laser beam, a diffraction grating 3 arranged in front of the laser beam source 2, a polarizing beam splitter 4, a collimator lens 5, a light-receiving element 6, a switch circuit 7 and a control system 8.

The laser beam source 2 is constructed from a semiconductor laser such as a laser diode (LD) which emits a laser beam having a wavelength of 780~790 nm, for example.

The driving of the laser beam source 2 is controlled by the control system 8. For this purpose, the control system 8 includes a driver 82 for driving the laser beam source 2.

The driver 82 includes a power supply circuit for supplying power to the laser beam source 2, and it is operated by a monitoring current value to be inputted thereto. The power output of the laser beam source 2 is set, for example, to be 2 mW when reading out information and 35 mW when writing in information.

During both the reading out and writing in of information, the laser beam emitted from the laser beam source 2 spreads out as it progresses forward (diverging), and in so doing forms a prescribed intensity distribution (illuminance distribution) like the Gaussian distribution shown in FIG. 3. This emitted laser beam has its highest intensity along its optical axis 15, and an effective optical path region 16 is formed with a prescribed range around the optical axis 15. Laser light 17 which lies within this effective optical path region 16 is used for the reading out and writing in of information for an optical disc.

Now, during both the reading out and writing in of information, the laser light 17 emitted by the laser beam source 2 and lying within the effective optical path region 16 passes through the diffraction grating 3 and then through a polarization plane 41 of the polarizing beam splitter 4. The laser beam is then collimated by the collimator lens 5 to form parallel rays, and the rays are then focused via a mirror or a pickup lens (objective lens) not shown in the drawings onto a recording surface of an optical disc in the form of a spot. Further, during reading out of information, the light reflected from the recording surface of the optical disc is refracted by the polarization plane 41 of the polarizing beam splitter 4 at a right angle toward a light-receiving element (not shown in the drawings) which is used for detecting the information.

As shown in FIG. 3, laser light 18 which lies outside the effective optical path region 16 has a smaller intensity than the laser light 17 which lies within the effective optical path region 16 and is therefore not used to read out or write in information. In this region outside the effective optical path region 16, there is provided a light-receiving element 6 for detecting the intensity (quantity of light) of the laser beam emitted by the laser beam source 2 in a state that it is mounted to a base plate 63.

The light-receiving element 6 is constructed from a so-called split photodiode (PD), and it includes a first light-receiving region 61 and a second light-receiving region 62 which are mutually independent of each other. Each of the first light-receiving region 61 and the second light-receiving region 62 carries out photoelectrical conversion of the received light, respectively, and then outputs an electrical current having a value in response to the intensity (quantity) of such received light.

As shown in FIG. 2, in the present embodiment the first light-receiving region 61 is formed into a roughly L-shaped configuration, with the main portion thereof being positioned relatively near the optical axis 15. Further, the second light-receiving region 62 is formed into a roughly square-shaped configuration and is positioned inside the right angle space formed by the L-shaped first light-receiving region 61, and in this way the second light-receiving region 62 is arranged at a position that is relatively farther from the optical axis 15 as compared with the position of the main portion of the first light-receiving region 61.

Now, as shown in FIG. 3, the intensity (quantity of light) of the laser beam 18 becomes smaller with increasing distance from the optical axis 15. Therefore, when the effective light-receiving surface areas of the first light-receiving region 61 and the second light-receiving region 62 are the same, the electrical current outputted by the first light-receiving region 61 which is relatively closer to the optical axis 15 will be larger than the electrical current outputted by the second. light-receiving region 62.

Further, as illustrated in FIG. 2, the base plate 63 is provided with three terminals 64, 65 and 66. The positive terminal and negative terminal of the first light-receiving region 61 are connected respectively to the terminal 64 and the terminal 65, and the positive terminal and negative terminal of the second light-receiving region 62 being connected respectively to the terminal 66 and the terminal 65.

The terminals 64 and 66 are connected to a positive output terminal 73 respectively through switches 71 and 72 of the switch circuit 7, and the terminal 65 is connected to a negative output terminal 74.

As described above, the light-receiving element 6 is constructed from two light-receiving regions made up of the first light-receiving region 61 and the second light-receiving region 62. Therefore, it is possible to create three sensitivity levels (i.e., first and second levels corresponding to the individual regions, and a third level corresponding to the combination thereof) by the light-receiving element 6 by selecting an appropriate open/close pattern for the switches 71 and 72. Namely, by selecting either one of output currents from the first and the second light-receiving regions 61 and 62 or a combination of the output currents from the light-receiving regions 61 and 62, it is possible to set the sensitivity of the light-receiving element 6 into the three levels.

In more detail, by closing the switch 71 and opening the switch 72, it is possible to use the output of just the first light-receiving region 61 (to establish the intermediate sensitivity level out of the three possible sensitivity levels). Further, by opening the switch 71 and closing the switch 72, it is possible to use the output of just the second light-receiving region 62 (to establish the lowest sensitivity level out of the three possible sensitivity levels). Furthermore, by closing both the switch 71 and closing the switch 72, it is possible to use the total output of both the first light-receiving region 61 and the second light-receiving region 62 (to establish the highest sensitivity level out of the three possible sensitivity levels).

In this regard, the opening and closing of the switches 71, 72 in the switch circuit 7 are controlled automatically or manually.

The analog signals (electrical current values) outputted from the output terminals 73, 74 of the switch circuit 7 are inputted into the driver 82. Based on this input, the driver 82 sets or adjusts the output of the laser beam source 2 at an appropriate level for either reading out of information (e.g., 2 mW) or writing in of information (e.g., 35 mW).

In this connection, it is preferred that a reinforcing member (in particular, a reinforcing plate) is provided on the rear side of the base plate 63 on at least the portion corresponding to the position of the light-receiving element 6 in order to prevent the light-receiving element 6 from being deformed or the like.

Further, it is also preferred that the front surfaces of the light-receiving element 6 (i.e., the light-receiving surfaces of the first light-receiving region 61 and the second light-receiving region 62) are covered with a covering layer to protect such surfaces. In this regard, this covering layer may be made from a variety of resin materials.

Next, a description will be given for an example of adjusting the output of the laser beam source 2 of the laser beam emitting device 1.

First, a laser beam source 2 having guaranteed characteristics is used. Namely, there is used a laser beam source 2 which emits a laser beam having a predetermined intensity value (reference intensity of the laser beam) (e.g., 35 mW) when applying a known fixed electrical current (e.g., 70 ) thereto.

Then, with the switch 71 in an open state and the switch 72 in a closed state (i.e., with the sensitivity set at the lowest level in the three sensitivity levels), the driver 82 is driven to apply the above-described fixed electrical current to the laser beam source 2 to cause the laser beam source 2 to emit a laser beam. In this state, the output signal from the switch circuit 7 (i.e., from the output terminals 73, 74) is detected, and the amount of such detection signal is defined as P.

On the other hand, with the switch 71 in a closed state and the switch 72 in an open state (i.e., with the sensitivity set at the intermediate level in the three sensitivity levels), the driver 82 is driven to apply the above-described fixed electrical current to the laser beam source 2 to cause the laser beam source 2 to emit a laser beam. In this state, the output signal from the switch circuit 7 (i.e., from the output terminals 73, 74) is detected, and the amount of such detection signal is defined as $P_2$.

Further, with both the switch 71 and the switch 72 in a closed state (i.e., with the sensitivity set at the highest level in the three sensitivity levels), the driver 82 is driven to apply the above-described fixed electrical current to the laser beam source 2 to cause the laser beam source 2 to emit a laser beam. In this state, the output signal from the switch circuit 7 (i.e., from the output terminals 73, 74) is detected, and the amount of such signal is defined as $P_3$.

In this case, a predetermined reference signal level (e.g., 20 $\mu$A) is also set in advance. The reference signal level corresponds to the reference intensity of the laser beam emitted by the laser beam source 2, and it is defined as $P_0$.

Then, by comparing $P_0$ with $P_1$, $P_2$ and $P_3$, the level which is closest to $P_0$ is selected from among the levels $P_1$, $P_2$ and $P_3$. Thereafter, the open/close patterns for the switches 71, 72 are also set so as to correspond to the selected output signal. For example, in the case where P is selected, the switch 71 is closed and the switch 72 is opened. In this way, it is possible to carry out calibrations related to the characteristics (photoelectric sensitivity, etc.) of the light-receiving element.

The above-described adjustment should be carried out on the output of the laser beam source 2 at least once when either of the reading out of information or the writing in of information is to be carried out.

In the laser beam emitting device 1 adjusted in the this way, the output of the laser beam source 2 is changed based on the output signal from the light-receiving element 6.

Namely, in the case where the output of the laser beam source 2 is to be set at the time when the writing in of information is to be carried out, the electrical current applied to the laser beam source 2 is increased while monitoring the output signal ($P_1$, $P_2$ or $P_3$) from the light-receiving element 6 in order to gradually increase the intensity of the laser beam emitted by the laser beam source 2. Then, at the moment the output signal from the light-receiving element 6 reaches the reference signal level $P_0$ at the writing in of information (i.e., the level corresponding to an output of 35 mW for the laser beam source 2), the value of the electrical current applied to the laser beam source 2 is kept constant.

On the other hand, if it is required to switch from this state to a state where the output of the laser beam source 2 is to be reset for the reading out of information, the electrical current applied to the laser beam source 2 is then decreased while monitoring the output signal ($P_1$, $P_2$ or $P_3$) from the light-receiving element 6 in order to gradually decrease the intensity of the laser beam emitted by the laser beam source 2. Then, at the moment the output signal from the light-receiving element 6 reaches the reference signal level $P_0$ at the reading out of information (i.e., the level corresponding to an output of 2 mW for the laser beam source 2), the value of the electrical current applied to the laser beam source 2 is kept constant.

By carrying out the above-described adjustments in the laser beam emitting device 1 according to the present invention, even if dispersions or deviations occurs in factors such as the individual characteristics of the light-receiving element 6, the position of the light-receiving element 6 (i.e., the distance from the optical axis 15 and the distance from the laser beam source 2), the intensity distribution (far field pattern) of the laser beam and the like, such differences will be absorbed by the selection of an output signal closest to the reference signal level, and this makes it possible to normally obtain a fixed level detection signal for the intensity of the laser beam emitted by the laser beam source 2. Consequently, because this makes it possible to accurately detect the intensity of the laser beam emitted by the laser beam source 2, it becomes possible to reliably set the intensity of the laser beam emitted by the laser beam source 2 at respective appropriate levels for reading out information and writing in information.

Now, it should be noted that the laser beam emitting device of the present invention is not limited to the above description of the embodiment shown in the drawings, and it is possible to substitute any of the parts and elements of the above embodiment with other parts and elements capable of performing equivalent functions.

In particular, factors such as the shape, arrangement and relative size of the effective light-receiving surface areas of the first light-receiving region 61 and the second light-receiving surface region 62 can be freely changed. For example, these light-receiving regions can be divided in either the lengthwise or widthwise direction in FIG. 2, and it is possible to use light-receiving regions having different effective light-receiving surface areas.

Further, it is also possible to use three or more light-receiving regions. In such case, it becomes possible to carry out even more precise adjustments and settings.

As stated above, the laser beam emitting device according to the present invention makes it possible to carry out highly accurate detection of the intensity of the laser beam emitted by the laser beam source. Consequently, when the laser beam emitting device according to the present invention is used in an optical pickup for reading out information from and writing information onto an optical disc, it is possible to reliably set the intensity of the laser beam emitted by the laser beam source at the respective appropriate level for reading out or writing in information.

In particular, by selecting either one of electrical current values from at least two light-receiving regions located at different distances from the optical axis or an appropriate combination thereof, it is possible to adjustments at three or more levels, whereby it becomes possible to carry out multilevel adjustments with a simple structure.

Finally, it is to be understood that the laser beam emitting device according to the present invention is not limited to the example structures described above, and it is possible to make various changes and additions without departing from the scope and spirit of the present invention as defined in the appended claims.

What is claimed is:

1. A laser beam emitting device, comprising:
   a laser beam source for emitting a laser beam having a predetermined effective optical path region;
   a light-receiving element positioned outside the effective optical path region of the laser beam emitted by the laser beam source and having at least two light-receiving regions for detecting intensity of the emitted laser beam; and
   adjustment means for adjusting the output of the laser beam source in response to the intensity of the emitted laser beam detected by the light-receiving element, wherein the light-receiving element having the at least two light-receiving regions is capable of providing at least two sensitivity levels, and wherein the adjustment means adjusts the output of the laser beam source in response to the intensity of the emitted laser beam detected by at least one of the light-receiving regions of the light-receiving element.

2. The laser beam emitting device as claimed in claim 1, wherein the light-receiving element is capable of providing the at least two sensitivity levels by selecting one of the electrical current values output from the light-receiving regions or any combination of these electrical current values, wherein the laser beam emitting device further comprises switch means for switching the sensitivity level of the light-receiving element between said at least two sensitivity levels so as to meet a sensitivity level at which the intensity of the laser beam emitted from the laser beam source is detected, and wherein the adjustment means adjusts the output of the laser beam source in response to the intensity of the emitted laser beam detected at the sensitivity level selected by the switch means.

3. The laser beam emitting device as claimed in claim, 2 wherein the light-receiving element is capable of providing three sensitivity levels by selecting one of the electrical current values output from the plurality of light-receiving regions or any combination of these electrical current values.

4. The laser beam emitting device as claimed in claim 3, wherein the at least two light-receiving regions of the light-receiving element include a first light-receiving region located outside the effective optical path region and a second light-receiving region located at a position farther from the optical axis than the position of the first light-receiving region, and wherein the light-receiving element is capable of providing three sensitivity levels by selecting either one of electrical current values output from the first and second light-receiving regions or a combination of these electrical current values.

5. The laser beam emitting device as claimed in claim 4, wherein the first light-receiving region is formed into a roughly L-shaped configuration and the second light-receiving region is formed into a roughly square-shaped configuration arranged inside the corner space of the L-shaped first light-receiving region.

6. An optical pickup for use in an optical disc drive, comprising:
   a laser beam source for emitting a laser beam toward an optical disc, the Laser beam having a predetermined effective optical path region;
   a laser beam receiving element for receiving the laser beam reflected on the optical disc to produce electrical signals responsive to the intensity of the received laser beam;
   detection means for detecting an intensity of the laser beam emitted from the laser beam source, the detection means being positioned outside the effective optical path region of the laser beam emitted by the laser beam source and having at least two light-receiving regions; and
   adjustment means for adjusting the output of the laser beam source in response to the intensity of the emitted laser beam detected by the detection means, wherein the detection means having the at least two light-receiving regions is capable of providing at least two sensitivity levels, and wherein the adjustment means adjusts the output of the laser beam source is adjusted in response to the intensity of the emitted laser beam detected by at least one of the plurality of the light-receiving regions of the detecting means.

7. The optical pickup as claimed in claim 6, wherein the detection means is capable of providing the at least two sensitivity levels by selecting one of the electrical current values output from the light-receiving regions or any combination of these electrical current values, wherein the laser beam emitting device further comprises switch means for switching the sensitivity level of the detection means between said at least two sensitivity levels so as to meet a sensitivity level at which the intensity of the laser beam emitted from the laser beam source is detected, and wherein the adjustment means adjusts the output of the laser beam source in response to the intensity of the emitted laser beam detected at the sensitivity level selected by the switch means.

8. The optical pickup as claimed in claim 7, wherein the detection means is capable of providing three sensitivity levels by selecting one of the electrical current values output from the plurality of light-receiving regions or any combination of these electrical current values.

9. The optical pickup as claimed in claim 8 wherein the at least two light-receiving regions of the detection means include a first light-receiving region located outside the effective optical path region and a second light-receiving region located at a position farther from the optical axis than the position of the first light-receiving region, and the detection means is capable of providing three sensitivity levels by selecting either one of the electrical current values output from the first and second light-receiving regions or a combination of these electrical current.

10. A laser beam emitting device, comprising:

a laser beam source for emitting a laser beam having a prescribed effective optical path region; and a light-receiving element positioned outside the effective optical path region of the laser beam emitted by the laser beam source and having a plurality of light-receiving regions for detecting intensity of the emitted laser beam, wherein the output of the laser beam source is adjusted in response to the intensity of the emitted laser beam detected by at least one of the plurality of the light-receiving regions of the light-receiving element, and further wherein the light-receiving element includes a first light-receiving region located at a position near the optical axis and a second light-receiving region located at a position farther from the optical axis than the position of the first light receiving region and further wherein the light-receiving region is formed into a roughly L-shaped configuration and the second light-receiving region is formed into a roughly square-shaped configuration arranged inside the corner space of the L-shaped first light-receiving region.

* * * * *